US009075102B2

(12) United States Patent
Ham (10) Patent No.: US 9,075,102 B2
(45) Date of Patent: Jul. 7, 2015

(54) MAGNETIC RESONANCE IMAGING SYSTEM COMPRISING A POWER SUPPLY UNIT ADAPTED FOR PROVIDING DIRECT CURRENT ELECTRICAL POWER

(75) Inventor: Cornelis Leonardus Gerardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 696 days.

(21) Appl. No.: 13/126,359

(22) PCT Filed: Oct. 29, 2009

(86) PCT No.: PCT/IB2009/054796
§ 371 (c)(1),
(2), (4) Date: Apr. 27, 2011

(87) PCT Pub. No.: WO2010/052616
PCT Pub. Date: May 14, 2010

(65) Prior Publication Data
US 2011/0210739 A1      Sep. 1, 2011

(30) Foreign Application Priority Data

Nov. 5, 2008 (EP) .................................. 08168322

(51) Int. Cl.
G01R 33/44    (2006.01)
G01R 33/28    (2006.01)
H02J 9/06     (2006.01)
G01R 33/385   (2006.01)

(52) U.S. Cl.
CPC ............ *G01R 33/28* (2013.01); *G01R 33/3852* (2013.01)

(58) Field of Classification Search
CPC ........................... G01R 33/28; G01R 33/3852
USPC ......................................................... 324/318
See application file for complete search history.

(56) References Cited

U.S. PATENT DOCUMENTS

| 4,535,291 | A | * | 8/1985 | Lee et al. ........................ 324/320 |
| 4,990,878 | A | * | 2/1991 | Takechi et al. ................. 505/211 |
| 5,663,647 | A |   | 9/1997 | Wirth |
| 5,828,216 | A | * | 10/1998 | Tschudin et al. ............. 324/322 |
| 6,072,315 | A | * | 6/2000 | Slade ............................ 324/322 |
| 6,154,031 | A |   | 11/2000 | Hughes |
| 6,229,311 | B1 |   | 5/2001 | Abenhaim |
| 6,400,157 | B1 | * | 6/2002 | Bonanni et al. ............... 324/322 |
| 6,410,996 | B1 |   | 6/2002 | Kuth |
| 6,590,391 | B1 |   | 7/2003 | Shudo et al. |

(Continued)

FOREIGN PATENT DOCUMENTS

| DE | 19732120 A1 | 12/1998 |
| DE | 102007027449 A1 | 8/2008 |

(Continued)

*Primary Examiner* — Melissa Koval
*Assistant Examiner* — Rishi Patel (57) ABSTRACT

A MRI system for acquiring MRI image data comprising a data acquisition means comprising a plurality of subunits for acquiring MRI image data, a power distribution means for providing the means for acquiring MRI image data with electrical power, the power distribution means comprising: a power supply unit adapted for providing direct current electrical power from an alternating current electrical mains, a power bus adapted for supplying the subunits with the direct current electrical power, control means for controlling the supply of direct current electrical power by the power bus to the subunits.

11 Claims, 4 Drawing Sheets

(56) References Cited

U.S. PATENT DOCUMENTS

| | | | |
|---|---|---|---|
| 2001/0001807 A1* | 5/2001 | Green | 600/411 |
| 2006/0038568 A1* | 2/2006 | Oppelt | 324/322 |
| 2006/0288710 A1* | 12/2006 | Legall et al. | 62/6 |
| 2007/0164746 A1* | 7/2007 | Jevtic et al. | 324/322 |
| 2007/0285021 A1 | 12/2007 | Jauster et al. | |
| 2008/0068011 A1 | 3/2008 | Staats et al. | |
| 2009/0045812 A1* | 2/2009 | Staats et al. | 324/318 |
| 2009/0309598 A1* | 12/2009 | Zhu et al. | 324/322 |

FOREIGN PATENT DOCUMENTS

| | | |
|---|---|---|
| EP | 0562791 A1 | 9/1993 |
| EP | 1085339 A1 | 3/2001 |
| EP | 1503474 A1 | 2/2005 |
| JP | 02034150 A | 2/1990 |
| JP | 2002224079 A | 8/2002 |
| WO | 9617260 A1 | 6/1996 |

\* cited by examiner

MAGNETIC RESONANCE IMAGING SYSTEM COMPRISING A POWER SUPPLY UNIT ADAPTED FOR PROVIDING DIRECT CURRENT ELECTRICAL POWER

FIELD OF THE INVENTION

The invention relates to magnetic resonance imaging systems and in particular to the distribution of electrical power in magnetic resonance imaging systems.

BACKGROUND OF THE INVENTION

A static magnetic field is used by Magnetic Resonance Imaging (MRI) scanners to align the nuclear spins of atoms as part of the procedure for producing images within the body of a patient. During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used.

An MRI system consists of many subunits, each powered with mains voltage. A difficulty is that different countries or regions used different mains voltages. For example, European utilities provide AC power with a frequency of 50 Hz, whereas in the United States and Canada 60 Hz is standard. A single phase of Alternating Current (AC) electrical power in the United States is 120V, and a single phase of AC electrical power in Europe is 240 V. If the subunit of the MRI systems is not able to work with the AC power provided, then the unit will need a power transformer and a rectifier. Transformers are large devices, and cannot be used close to the magnet unless they are magnetically shielded. The electromagnetic fields generated by the AC electrical power and transformers can interfere with the acquisition of MRI image data. The power of all of these individual subunits is not managed efficiently. Since MRI systems have a large number of subunits, there can be a large number of power transformers and adaptors in order to power all of the subunits. All of these transformers are expensive and consumes valuable space in the hospital. The wiring for MRI systems can become quite complicated and the voltages used are hazardous.

US Patent Application Publication 2008/0068011 describes a remotely powered magnetic resonance injector.

SUMMARY OF THE INVENTION

The invention provides for an MRI system for acquiring MRI image data. Embodiments of the invention are given in the dependent claims.

Embodiments of the invention address the aforementioned problems by using a Direct Current (DC) power distribution for the MRI system. The DC power distribution system is located at a mains voltage connection and electrical power is converted to a single DC voltage or multiple DC voltages. The DC voltage is then distributed to the individual subunits of the MRI system.

A standard voltage is distributed to the majority of the subunits. High power subunits such as the gradient amplifier or the RF amplifier can benefit from using a specialized power. A safer voltage can be chosen for the distribution of DC power, e.g. 40V. If necessary, each device can locally generate its own desired DC voltage via DC-DC conversion. DC to DC power conversion is a well-known, reliable compact technology.

Embodiments of the invention have at least some of the following advantages:

Cost reduction by removing power supplies for each of the devices.

Volume reduction (no transformers)

Reduced development cost, because there is no need to test each subunit with the required voltage ranges that are required worldwide (50/60 Hz, 110/220/etc V).

DC voltages such as 40V DC are safer than e.g. 220V/50 Hz.

The potential of 50 Hz or 60 Hz noise interfering with the MRI system is eliminated.

The system filter box is simplified, because there is only one voltage.

Additional advantages will be described in the embodiments.

Embodiments of the invention provide for an MRI system for acquiring MRI image data comprising a data acquisition means comprising a plurality of subunits for acquiring MRI image data. The subunits are the individual components of the MRI system. Examples of subunits are a gradient amplifier, a radio frequency amplifier, a combined RF amplifier and transceiver, a high-order shim supply, a cooling system, a cryocooler, a patient support, physiology centers, gradient coils, RF coils and antennas, the electronics in the examination room, observation cameras, computer displays and monitors for patient observation a computer system and a computer system. The computer system can comprise of one or several different computers, it can be a scan control computer, which is the host in the console, a reconstruction computer, which reconstructs the images and a controller which controls the MRI system. The MRI system also comprises a power distribution means which is used for powering the means for acquiring the MRI image data with electrical power.

The power distribution means comprises, a power supply unit adapted for providing direct current, electrical power from an alternating current electrical mains, a power bus which is adapted for supplying the subunits with direct current electrical power, and a control means for controlling the supply of direct current electrical power by the power bus to the subunits.

The power bus can be constructed in several different ways. It can be a single voltage which is provided to the subunits and they are simply connected to the power bus or there can be a variety of voltages which are provided. There can be a power bus on the back of the power supply which the MRI subunits are all connected to, or there can be lines or lines which are fed into the examination room and then shorter leads are connected between the individual subunits and power bus. A single voltage power bus has the advantage that the system filter box is simpler. The control means can be connected to the power bus and it can be used for switching subunits of the MRI system on and off. A controller for controlling the power consumption can be part of the control means and this can be incorporated into the power supply or it can be controlled through one of the computer systems.

Embodiments of the invention have the advantage that a separate AC connector is not used for every single subunit. Normally each subunit would have its own connection to the AC electrical mains. By providing DC power to each of the subunits, the need for multiple AC connections is eliminated. This reduces the amount of money needed to construct the subunits and it also provides for better MRI images since the transformers will typically produce 50 or 60 Hz noise which can cause ghosting in images when they are not shielded correctly. Supplying DC voltage is also an advantage because it is less dangerous than AC voltage. A low voltage such as 40 V or 12 V could be selected and used to make the power supply system less lethal. Having a central power bus also allows the overall power to be controlled and regulated.

In another embodiment the power distribution means is further comprised of an uninterruptible power supply adapted for supplying electrical power. When the electrical power of the alternating current electrical mains is interrupted, the uninterruptible power supply supplies energy for the MRI system to continue functioning. In this embodiment the uninterruptible power supply comprises at least one battery adapted for supplying a direct current electrical power to the power bus. The advantage of this embodiment is that the DC electrical power for the entire system is provided by a battery in the event of power failure. It is therefore very easy to supply the necessary power when the power supply is interrupted. Normally a generator is needed to first produce AC power which is used to power the AC mains and then the power is converted back to direct current by many of the subunits. This is highly inefficient and batteries are much less expensive than emergency generators. An AC universal power supply for an MRI system costs about 20000 Euro. This functionality can easily be provided by adding a big battery in parallel to the DC supply. The battery will be considerably less expensive than an AC generator.

In another embodiment one of the subunits is a gradient amplifier for powering the magnetic field gradient coils. The gradient amplifier is adapted for providing direct current electrical power from alternating current electrical mains. The gradient amplifier is further adapted to supply the power bus with the direct current electrical power and the power supply unit is the gradient amplifier. This embodiment is very advantageous, because the gradient amplifier is one of or is the greatest consumer of electrical power in an MRI system. The gradient amplifier needs to supply huge currents to the gradient coils during the operation of the MRI system. Having the power supply unit and the gradient amplifier would be very efficient and it would be cost effective to combine these units into one. Essentially the gradient amplifier would be modified to supply electrical power to the rest of the MRI system.

In another embodiment one of the subunits is a radio frequency amplifier for powering the radio frequency coils. The RF amplifier can be powered with a DC voltage. The power supply of the RF amplifier can be removed, providing a cost saving. Additionally, this allows a smaller RF amplifier to be constructed. This would allow the MRI system to become more compact and space efficient. In an MRI system, radio frequency amplifiers produce radio frequency signals which are used to knock down spins within the MRI system. The radio frequency coil delivers the radio frequency energy to a volume within the patient which is being examined. Many times the radio frequency amplifier and transmission coils are integrated with a radio frequency receiver and receiver coils are integrated with the radio frequency transmitter coils. It is understood that when referring to a radio frequency amplifier it also refers to the combination of radio frequency amplifiers and receivers. The same is also true for the radio frequency coils; this refers to both coils for transmitting radio frequency energy and also for coils for transmitting and receiving radio frequency energy. This embodiment is highly advantageous, because the radio frequency amplifiers can be run directly off of direct current electrical power. By supplying them with a DC current, the expense of adding a transformer to the radio frequency amplifier can be eliminated for a cost reduction.

In another embodiment one of the subunits is a liquid cooling cabinet for cooling heat dissipating fluids. The liquid cooling cabinet is adapted to be powered with the direct current electrical power provided by the power bus. This is advantageous because many liquid cooling cabinets are run using alternating electric power with the frequency being determined by the mains electrical power. When a high level of cooling is not needed, valves reduce the flow through the fluid system. This is an inefficient, because the pump works against the valves and dissipate energy. By running off of a DC voltage, the system can be designed to have a variable flow rate and the amount of electrical power can be reduced which results in a reduction of the operating cost of the MRI system.

The current Liquid Cooling Cabinet (LCC) contains a set of pumps, coupled to the mains frequency. It has a fixed pumping speed, independent of the actual dissipation in the system. The pressure control is performed by adding flow restrictors, which induce a (large) pressure drop. This wastes energy. A set of pumps with variable speed is preferred. Using centrally distributed DC power facilities this improvement.

Embodiments of the invention also provide for a cryocooler being one of the subunits. Cryocoolers are devices which produce cryogenic temperatures and are used for cooling objects. The cryocooler has a thermal conduit which is in contact with a portion of the inside of the superconducting magnet, and the cooling capacity is determined by the oscillating frequency of the gas flow. Typically excess cooling capacity is regulated by the addition of electrical heaters within the cryogenic pressure vessel. The cooling capacity can also be regulated by controlling the frequency of the gas flow. Running from a DC power source facilitates the regulation of the cryocooler's cooling capacity using this technique.

In another embodiment one of the subunits is a superconducting magnet and another subunit is a magnet power supply for powering the superconducting magnet. The magnet power supply comprises an electrical power connection operable for connecting with the power bus of the MRI system. This embodiment is advantageous, because the magnet power supply is typically a service tool which may or may not be connected at all times to the magnet. By eliminating the AC power supply it is much easier for the superconducting magnet power supply to be carried around by service personnel. Again, removing the transformer reduces the cost of the magnet power supply. The addition of an electrical power connection operable for connecting with the power bus also makes it easy for personnel to remove or detach the magnet power supply.

In another embodiment the power supply is adapted to provide the power bus with a plurality of different electrical voltages. This is advantageous, because different subunits may need to have different voltages. If you have only a single voltage, then it is possible that the individual subunits may need DC to DC converters to obtain the proper operating voltage. The RF power supply and in particular the gradient power supply are major consumers of electrical power in the MRI system. Having a power bus with multiple voltage sources allows items that use a large electrical current to be placed on their own electrical circuit.

In another embodiment the power supply unit is adapted to provide the power bus with only a single voltage. The single voltage system also has advantages. Having a single voltage makes the central power distribution much simpler. A single system of cables with one voltage can be laid. The filter box only needs to filter a single voltage value in this case. This provides a cost savings.

In another embodiment the control means is further adapted for reducing the consumption of electrical power by controlling the distribution of electrical current to the subunits. This is an advantage, because all of the subunits of the magnet can be turned off or the power can be reduced from a central control system. When all subunits are on their own AC electrical connections it is more difficult to coordinate the power consumption and also turn off subunits that are not in use.

In another embodiment the control means is further comprised of a user interface operable for adjusting the consumption of the electrical power by the MRI system. This is advantageous, because MRI systems consume large amounts of electrical power. By providing the user interface or adjusting the consumption of electrical power, electrical energy can be saved when the system is not in use.

In another embodiment the control means is further adapted for managing the distribution of electrical power when the MRI system is not in use. This is an advantage, because the system can be configured to use less power in between patient examinations or during a work pause. The system can also be configured to save large amounts of energy in the evening when the MRI system is not in use. The central distribution of direct current power and the control system allow the individual subunits to be efficiently turned on and off to facilitate this power saving. When subunits are all connected to individual AC power, it is much more difficult to coordinate the energy savings.

In another embodiment, power bus is further adapted to transmit data between the power distribution means and the subunits. This has the advantage that power bus can be used as part of the control means for regulating the power to the subunits. The power bus can be adapted by adding a network cable such as a category 5 cable or optical fiber. The power bus can also be adapted by imposing a high frequency carrier onto one or more of the conductors used for transmitting electrical power. This has the advantage that no additional cables need to be added.

BRIEF DESCRIPTION OF THE DRAWINGS

In the following preferred embodiments of the invention will be described, by way of example only, and with reference to the drawings in which.

DETAILED DESCRIPTION

Like numbered elements in these figures are either identical elements or perform the same function. Elements which have been discussed previously will not necessarily be discussed in later figures if the function is identical.

Figure 1:
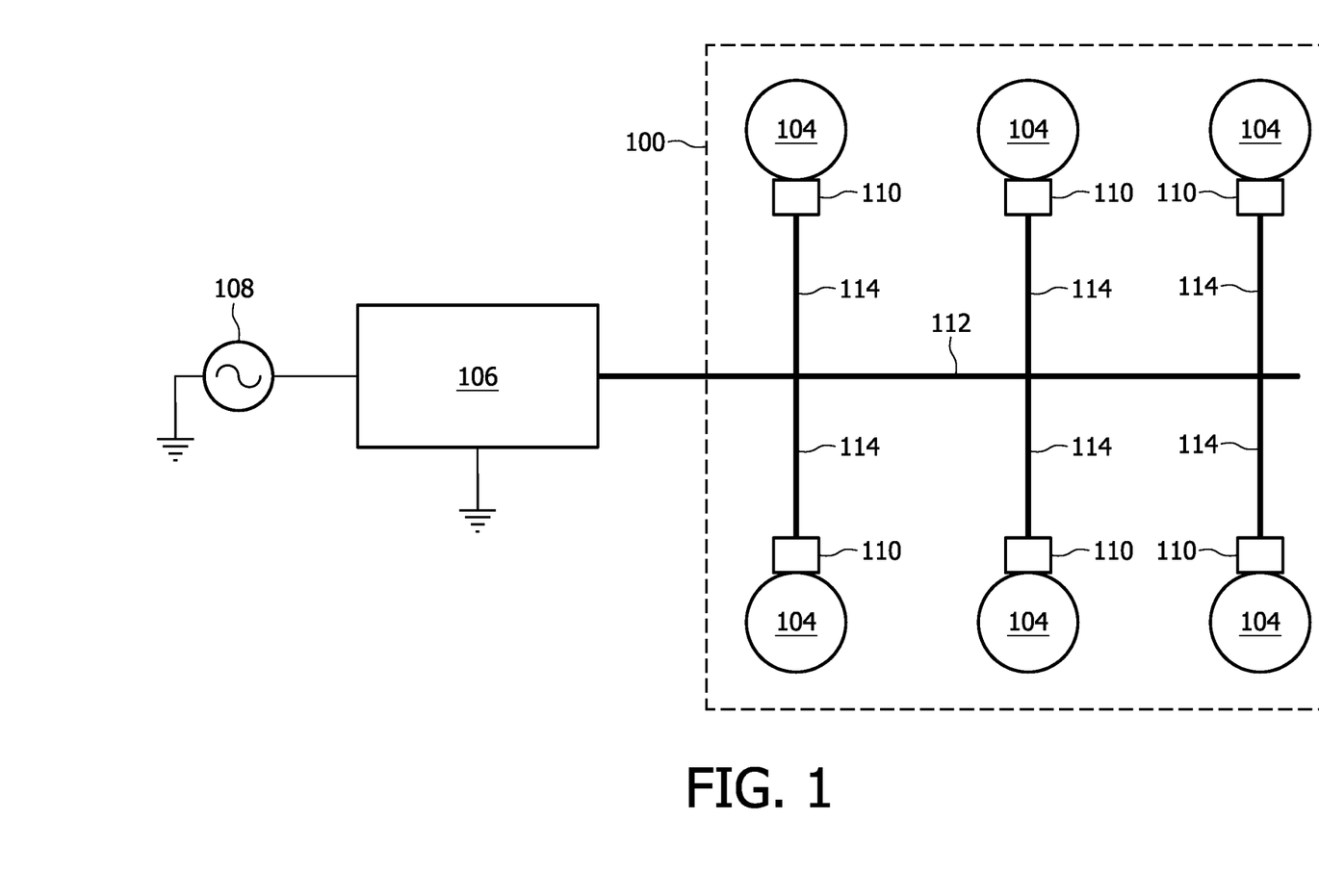
FIG. 1 is an idealized diagram showing an embodiment of an MRI system with a distributed power bus.

FIG. 1 shows an embodiment of an MRI system with a power bus 112 which extends into the data acquisition means 100 and provides a way of connecting the subunits 104 to the electrical power bus 112. This is an idealized figure which is intended to show the layout of the electrical system. There is an AC electrical mains 108 which provides AC electrical power. This is connected to the power supply 106. The power supply is then connected to the power bus 112 and the power bus extends into the vicinity of the data acquisition means 100. The data acquisition means 100 has electrical connections 114 between the power bus 112 and every subunit 104. There is one of these connections 114 for every subunit 104. Subunits 104 are connected to a control means 110 which is then connected to the electrical connection 114 between the power bus 112 and the subunit 104. The control means 110 is adapted for switching the power of the subunit 104 on or off or for regulating the amount of power. The subunit 104 can also be controlled via dedicated electrical controls to each control means 110 or they can be controlled by connecting them to a computer via a network.

Figure 2:
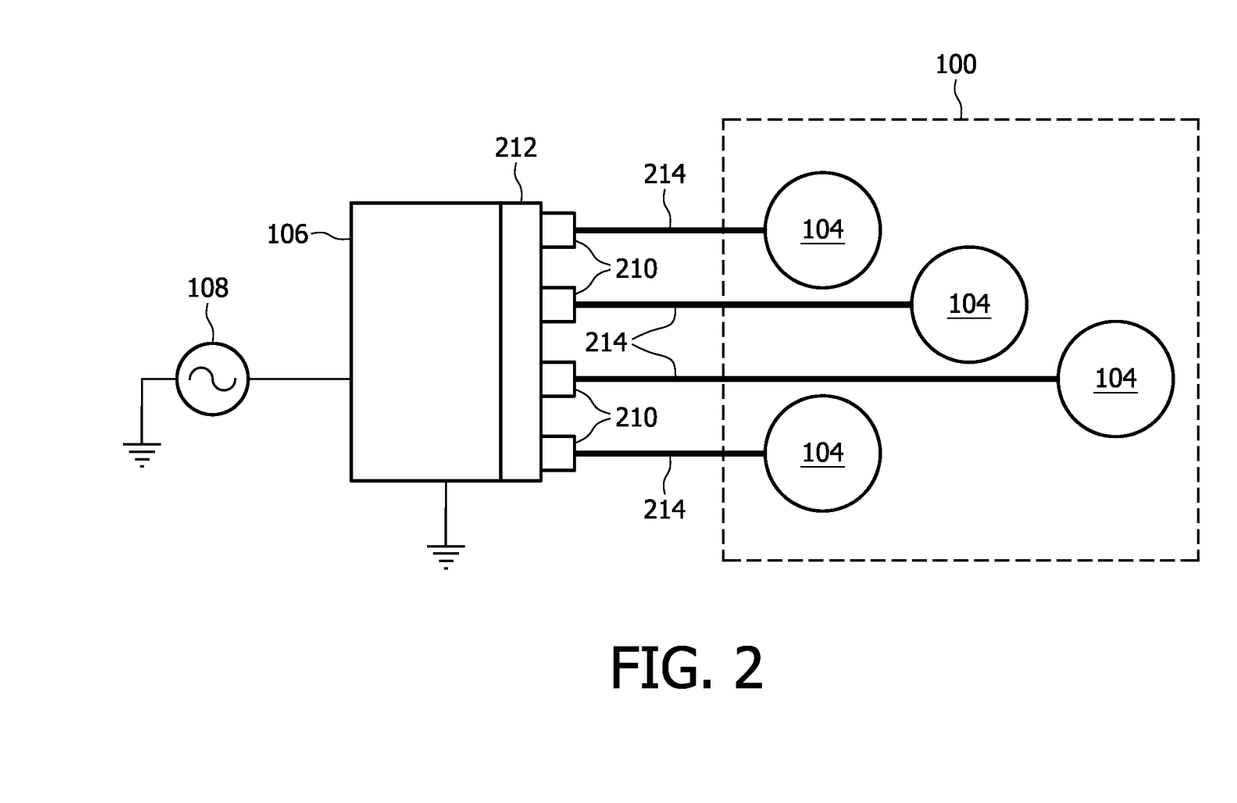
FIG. 2 is an idealized diagram showing an embodiment of an MRI system with a centralized power bus.

FIG. 2 also shows an embodiment of a MRI system. Again, this is an idealized figure which is intended to show the layout of the electrical system. In this embodiment, the power bus 212 is located in the vicinity of the power supply 106. There is an AC electrical mains 108 which is connected to the power supply 106. The power supply 106 provides DC electrical power and is connected to the power bus 212. The power bus 212 is connected to control means 210 which has the ability to either shut off or to regulate electrical power. The control means 210 are connected to an electrical connection 214 between the power bus 212 and a subunit 204. The advantage of this arrangement is that there is a single cable going to each subunit and it is possible to have a different DC voltage for each subunit 104. This embodiment allows the voltage to be tailored for each individual subunit 104.

Figure 3:
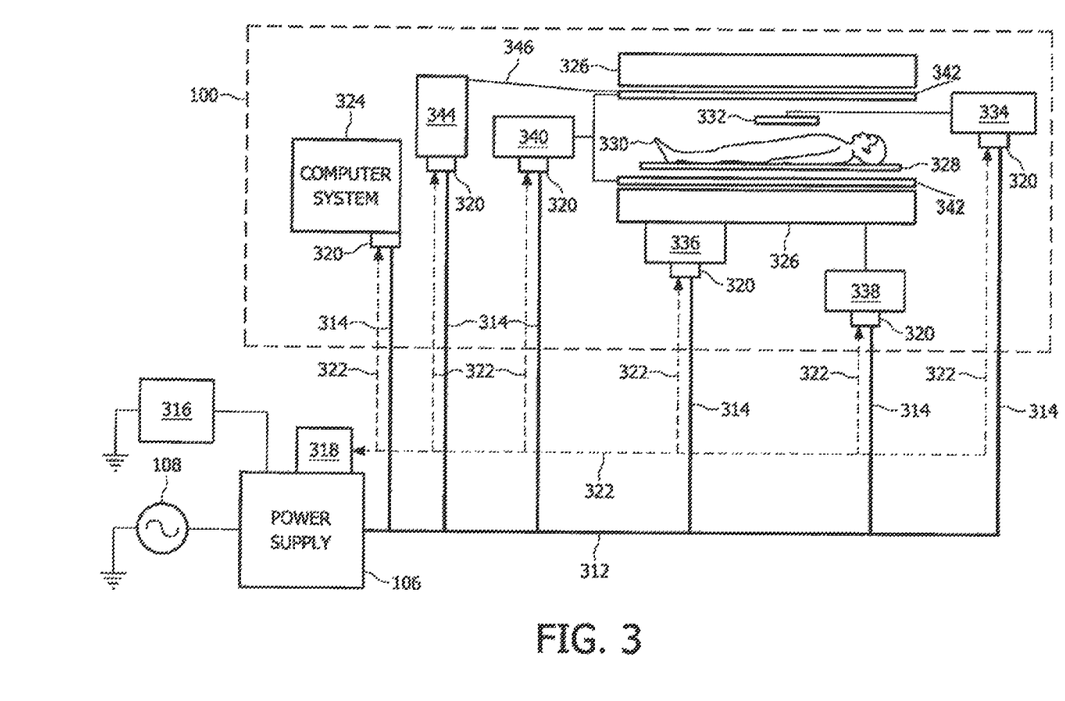
FIG. 3 is a diagram showing the power distribution system of an embodiment of an MRI system.

FIG. 3 shows a more detailed schematic of an embodiment of a MRI system. In this embodiment, there is an AC electrical mains 108 which is connected to the power supply 106. Also connected to the power supply 106 is an uninterruptible power supply 316. The uninterruptible power supply 316 comprises one or more batteries and is adapted for providing DC electrical power to the power supply 106 and the power bus 312 in the event that AC power is lost. The power supply 106 is connected to the power bus 312 and it is also connected to the power supply controller 318. The power supply controller functions as part of the control means for controlling the supply of DC current to the power bus 312. The power supply controller 318 is connected to a communication network 322. This can be implemented using a computer network such as an Ethernet. The power bus 312 itself can also be used to transport data flow. This can be implemented by incorporating network cable into the power bus or by imposing a high frequency carrier onto one or more of the conductors used for transmitting electrical power. The high frequency carrier is a low amplitude voltage superimposed upon the conductor that is adapted for transmission of data, but does not affect the transmission of power to the subunits 324, 334, 336, 338, 340, 344. In this embodiment the network 322 is connected to the data acquisition means 100 and also the power bus 312 is connected to the data acquisition means 100. There is a connection between the power bus 312 and a power bus controller 320. There is a network connection 322 between the power supply controller 318 and the computer system 324 as well as the power bus controller 320. In this embodiment the computer system 324 has a direct connection with the power supply controller 318.

In this embodiment the computer system 324 can interact with the power supply controller 318 and forms part of the control system for regulating the power in the MRI system. This could also be implemented with power supply controller 318 controlling the power bus controllers 320 directly. The data acquisition means 100 has a computer system 324, a liquid cooling cabinet 344, a gradient power supply 340, a cryocooler 336, a magnet power supply 338, and an RF amplifier and/or receiver 334. Each of these subunits 324, 334, 336, 338, 340, 344 is connected to a power bus controller 320. Each power bus controller 320 is connected to an electrical connection 314 between the power bus 312 and the subunit 324, 334, 336, 338, 340, 344 and has a network connection 322. All of these subunits 324, 334, 336, 338, 340, 344 are connected to the power bus 312 and receive DC electrical power and are connected together through a computer network 322. The computer network 322 in this embodiment is operable for regulating the DC power each of the subunits 324, 334, 336, 338, 340, 344 receives.

The DC power can be shut off to individual subunits 324, 334, 336, 338, 340, 344 or a signal can be sent to the power bus controller 320 over the network 322 to regulate the power. The DC power bus 312 can supply a single electrical voltage and each of the units receives the same DC voltage. In this case some units can have DC to DC converters for producing different voltages. In an alternative embodiment, the power bus 312 can provide several different voltages.

In FIG. 3, there is also an MRI magnet 326. Within the MRI magnet 326 there is a patient support 328 for receiving a patient 330. The patient support 328 supports the patient during an examination or treatment. There is an RF transceiver coil 332 above the patient 330 and is connected to the RF amplifier 334. Inside the bore of the magnet, there are gradient coils 342. The gradient coils 342 are connected to the gradient power supply 340. There is a system of cooling hoses 346 connected to the gradient coils 342 These cooling hoses 346 connect the liquid cooling cabinet 344, which is adapted for cooling the fluid which is inside of the cooling hoses 346, and the gradient coils 342. The MRI magnet 326 is also connected to the magnet power supply 338. The magnet power supply 338 is capable of powering or depowering the MRI magnet 326. The magnet power supply 338 can be left in place at all times, or it can be removable. The magnet power supply 338 can be operated also without the network connection 322 and without the power bus controller 320. This would be the case if the magnet power supply 338 is being used as a service tool. A cryocooler 336 is used to cool the MRI magnet 326, and it is connected to the MRI magnet 326 using a thermal conduit.

In another embodiment, the subunits 324, 334, 336, 338, 340, 344 and the power supply controller 318 are not all on the same computer network 322. There can be dedicated lines running between the computer system 324 and the power supply controller 318 and to the different subunits 324, 334, 336, 338, 340, 344. For example, there may be a connection for each of the individual subunits 324, 334, 336, 338, 340, 344 and there may also be dedicated lines running from the power supply controller 318 to the power bus controllers 320.

Figure 4:
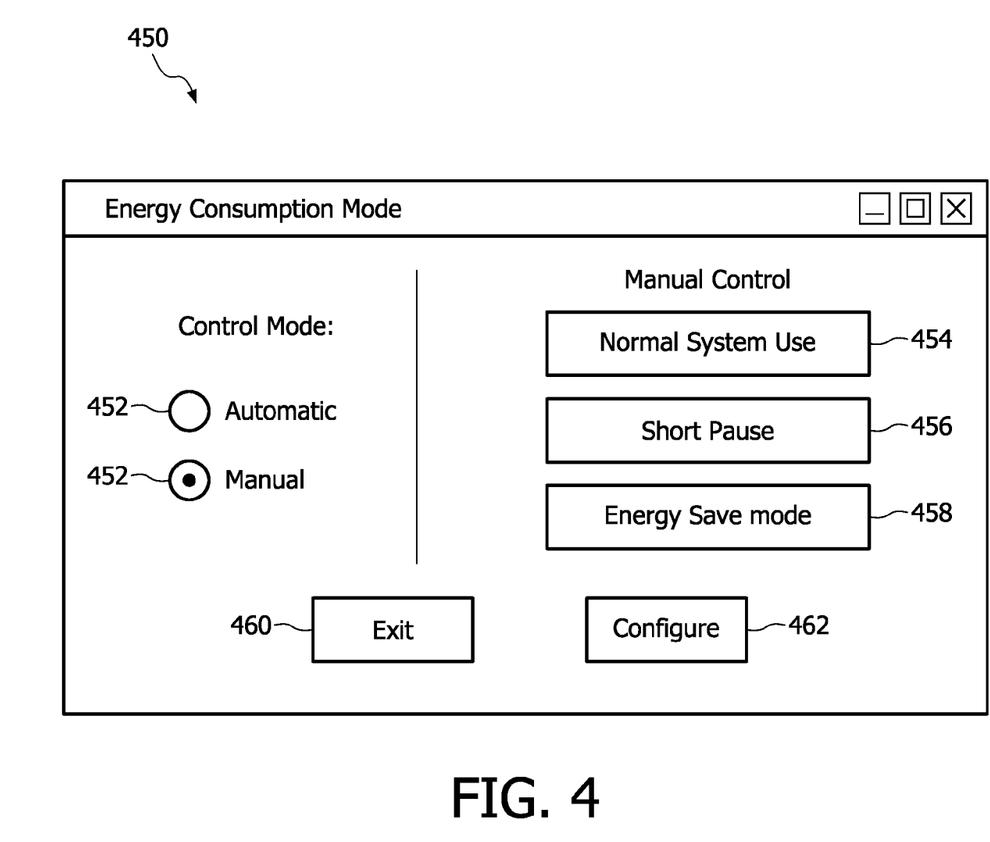
FIG. 4 is a diagram showing an embodiment of a graphical user interface for a computer.

FIG. 4 shows an embodiment of a dialogue box 450 which is operable for controlling the energy consumption of the MRI system. This dialogue box 450 has a selection means 452 which is operable for selecting between an automatic and a manual mode. In the manual mode an operator controls the power settings manually to control the energy consumption of the MRI system. In the automatic mode, an operator is able to configure the consumption of power by the MRI system automatically. For example, the system may reduce power to some subunits after a certain period of time and then after another period of time the power consumption is reduced further. This dialogue box shows several manual controls, the first is normal system use 454 and when the operator pushes this button all of the subunits of the MRI system are put into an operable mode. There is another button marked 'short pause' 456. This puts the MRI system into a mode where the system is not being used for a short period of time. This would shut off subunits which are not necessary for a short period of time but can be turned off to save energy. Then there is another button labeled 'energy saving mode' 458 and this is operable for selecting a mode of operation where all but the essential subunits of the MRI system are shut down to save power. An example would be to use this when the system is not being used overnight. Additionally there is a selection to exit the dialogue box 460. The selection labeled 'configure' 462 opens another more complicated dialogue box which allows the operator to configure what units are shut off or have their power reduced in each mode. It also allows the operator to configure the automatic power system regulation.

List Of Reference Numerals:

| | |
|---|---|
| 100 | Data acquisition means |
| 104 | Subunit |
| 106 | Power supply |
| 108 | AC electrical mains |
| 110 | Control means |
| 112 | Power bus |
| 114 | Electrical connection between power bus and subunit |
| 210 | Control means |
| 212 | Power bus |
| 214 | Electrical connection between power bus and subunit |
| 312 | Power bus |
| 314 | Electrical connection between power bus and subunit |
| 316 | Uninterruptible power supply |
| 318 | Power supply controller |
| 320 | Power bus controller |
| 322 | Network |
| 324 | Computer system |
| 326 | MRI magnet |
| 328 | Patient support |
| 330 | Patient |
| 332 | Transceiver coil |
| 334 | RF amplifier/receiver |
| 336 | Cryocooler |
| 338 | Magnet power supply |
| 340 | Gradient power supply |
| 342 | Gradient coils |
| 344 | Liquid cooling cabinet |
| 346 | Cooling hoses |
| 450 | Dialogue box |
| 452 | Selection between manual and automatic control |
| 454 | Put system into normal operating mode |
| 456 | Put system into standby mode |
| 458 | Shut down non-essential subunits |
| 460 | Exit dialogue box |
| 462 | Configure energy savings settings |

The invention claimed is:

1. A MRI system for acquiring MRI image data comprising:
   first coils configured to deliver radio frequency energy to a volume and second coils surrounding the volume and the first coils and configured to deliver magnetic field gradient;
   a plurality of subunits including a first amplifier for powering the first coils and a second amplifier for powering the second coils;
   a power supply for receiving electrical power from an alternating current electrical mains and providing a direct current;
   a power bus configured to connect the power supply to the plurality of subunits to supply the plurality of subunits and the first and second coils with the direct current; and
   a controller configured to control the supply of the direct current to the plurality of subunits.

2. The MRI system of claim 1, further comprising an uninterruptible power supply for supplying direct current to the power supply when the electrical power from the alternating current electrical mains is interrupted, the uninterruptible power supply comprising at least one battery.

3. The MRI system of claim 1, wherein the plurality of subunits further includes a liquid cooling cabinet for cooling heat dissipating fluids.

4. The MRI system of claim 1, further comprising a superconducting magnet, wherein the plurality of subunits further includes a cryocooler for cooling cryogenic fluids, the cryocooler is connected to the magnet via a thermal conduit.

5. The MRI system of claim 1, further comprising a superconducting magnet, wherein the plurality of subunits further includes a magnet power supply for powering the superconducting magnet.

6. The MRI system of claim 1, wherein the power supply is configured to provide the direct current at a plurality of voltages, and each of the plurality of subunits is configured to use one of the voltages.

7. The MRI system of claim 1, wherein the power supply is configured to provide the direct current at a single voltage, and each of the plurality of subunits is configured to use the single voltage.

8. The MRI system of claim 1, wherein the controller is configured to reduce the consumption of electrical power by controlling the supply of the direct current.

9. The MRI system of claim 8, wherein the controller comprises a user interface configured to adjust the consumption of electrical power.

10. The MRI system of claim 8, wherein the controller is further configured to manage distribution of the electrical power when the plurality of subunits is not in use.

11. The MRI system of claim 1, wherein the power bus is further configured to transmit data between the power supply and the plurality of subunits.

\* \* \* \* \*